United States Patent
Wu et al.

(10) Patent No.: US 9,859,123 B1
(45) Date of Patent: Jan. 2, 2018

(54) METHOD FOR FABRICATING SEMICONDUCTOR DEVICE

(71) Applicants: UNITED MICROELECTRONICS CORP., Hsin-Chu (TW); Fujian Jinhua Integrated Circuit Co., Ltd., Quanzhou, Fujian province (CN)

(72) Inventors: Chia-Chen Wu, Nantou County (TW); Pin-Hong Chen, Tainan (TW); Kai-Jiun Chang, Taoyuan (TW); Yi-An Huang, New Taipei (TW); Chih-Chieh Tsai, Kaohsiung (TW); Tzu-Chieh Chen, Pingtung County (TW); Tsun-Min Cheng, Changhua County (TW); Yi-Wei Chen, Taichung (TW)

(73) Assignees: UNITED MICROELECTRONICS CORP., Hsin-Chu (TW); Fujian Jinhua Integrated Circuit Co., Ltd., Quanzhou, Fujian province (CN)

(*) Notice: Subject to any disclaimer, the term of this patent is extended or adjusted under 35 U.S.C. 154(b) by 0 days.

(21) Appl. No.: 15/472,308

(22) Filed: Mar. 29, 2017

(30) Foreign Application Priority Data

Mar. 1, 2017 (CN) .......................... 2017 1 0116620

(51) Int. Cl.
*H01L 21/28* (2006.01)
*H01L 21/285* (2006.01)
*H01L 21/768* (2006.01)
*H01L 21/321* (2006.01)
*H01L 29/66* (2006.01)

(52) U.S. Cl.
CPC ...... *H01L 21/28518* (2013.01); *H01L 21/321* (2013.01); *H01L 21/76889* (2013.01); *H01L 29/665* (2013.01)

(58) Field of Classification Search
CPC ........... H01L 27/10888; H01L 23/5329; H01L 21/76805
See application file for complete search history.

(56) References Cited

U.S. PATENT DOCUMENTS

| | | |
|---|---|---|
| 6,551,927 B1 | 4/2003 | Chen |
| 2008/0081472 A1 | 4/2008 | Tanaka |
| 2013/0341620 A1* | 12/2013 | Birner .................... H01L 22/30 257/48 |

* cited by examiner

*Primary Examiner* — Mohammad Choudhry
(74) *Attorney, Agent, or Firm* — Winston Hsu

(57) ABSTRACT

A method for fabricating a semiconductor device is disclosed. A substrate having a conductive region is provided. A metal layer is deposited on the conductive region. The metal layer reacts with the conductive region to form a first metal silicide layer. A TiN layer is deposited on the metal layer. A SiN layer is deposited on the TiN layer. An annealing process is performed to convert the first metal silicide layer into a second metal silicide layer.

20 Claims, 4 Drawing Sheets

METHOD FOR FABRICATING SEMICONDUCTOR DEVICE

CROSS REFERENCE TO RELATED APPLICATION

This application claims the priority from CN application No. 201710116620.5, filed Mar. 1, 2017, which is included in its entirety herein by reference.

BACKGROUND OF THE INVENTION

1. Field of the Invention

The present invention relates to the field of semiconductor technology. More particular, the present invention relates to an improved method for fabricating a semiconductor contact device.

2. Description of the Prior Art

As the degree of integration in the semiconductor devices increases, the area of the memory cell decreases rapidly accordingly. The gap between the wiring area and the wiring in the memory unit is also reduced. In addition, the area of the contact structure for electrically connecting the device regions is also getting smaller. Therefore, how to reduce the resistance of the contact structure has become a challenge in this technical field.

In the related prior art, U.S. Patent Publication No. US2008/0081472 discloses a method of manufacturing a semiconductor element, which teaches the formation of a cobalt metal layer on the contact plug and heat treatment to form a layer of cobalt silicide layer. Then, a sulfuric acid solution that does not contain hydrogen peroxide is used to remove the unreacted cobalt metal layer.

U.S. Pat. No. 6,551,927 B1 discloses a CoSix process to improve junction leakage, which teaches the deposition of a titanium-rich titanium nitride layer and a titanium nitride layer on the cobalt metal layer. After the formation of the cobalt silicide layer by reacting the cobalt metal layer with the silicon substrate, the titanium-rich titanium nitride layer and the titanium nitride layer are removed.

However, the above-mentioned prior art still have shortcomings need to be improved. For example, because the titanium nitride layer has a columnar crystal structure, oxygen will still penetrate the titanium nitride layer and contact with the cobalt metal layer, resulting in cobalt oxide residual on the surface of the cobalt silicide layer, affecting the electrical performance of devices.

SUMMARY OF THE INVENTION

It is one object of the present invention to provide an improved method of manufacturing a semiconductor device to solve the above-mentioned drawbacks and shortcomings of the prior art.

A method for fabricating a semiconductor device is disclosed. A substrate having a conductive region is provided. According to the embodiment of the invention, a plurality of device structures and a plurality of conductive regions between the device structures are provided on the substrate. Each of the conductive regions comprises silicon elements.

A metal layer is then deposited on the plurality of device structures and the plurality of conductive regions. The metal layer reacts with the silicon elements of each conductive region to form a first metal silicide layer having a first metal atomic percentage. An unreacted metal layer is remained on the first metal silicide layer. A conformal TiN layer is then deposited on the metal layer.

A dielectric capping layer is deposited on the TiN layer. An annealing process is performed to convert the first metal silicide layer into a second metal silicide layer having a second metal atomic percentage.

According to the embodiment of the invention, the metal layer may comprise cobalt, nickel, or titanium.

These and other objectives of the present invention will no doubt become obvious to those of ordinary skill in the art after reading the following detailed description of the preferred embodiment that is illustrated in the various figures and drawings.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the invention.

Before the further description of the preferred embodiment, the specific terms used throughout the text will be described below.

The term "etch" is used herein to describe the process of patterning a material layer so that at least a portion of the material layer after etching is retained. For example, it is to be understood that the method of etching silicon involves patterning a mask layer (e.g., photoresist or hard mask) over silicon and then removing silicon from the area that is not protected by the mask layer. Thus, during the etching process, the silicon protected by the area of the mask will remain.

In another example, however, the term "etch" may also refer to a method that does not use a mask, but leaves at least a portion of the material layer after the etch process is complete. The above description is used to distinguish between "etching" and "removal". When "etching" a material layer, at least a portion of the material layer is retained after the end of the treatment. In contrast, when the material layer is "removed", substantially all the material layer is removed in the process. However, in some embodiments, "removal" is considered to be a broad term and may include etching.

The terms "forming", "depositing" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

According to various embodiments, for example, deposition may be carried out in any suitable known manner. For example, deposition may include any growth, plating, or transfer of material onto the substrate. Some known techniques include physical vapor deposition (PVD), chemical vapor deposition (CVD), electrochemical deposition (ECD), molecular beam epitaxy (MBE), atomic layer deposition (ALD), and plasma enhanced CVD (PECVD).

The term "substrate" described in the text is commonly referred to as a silicon substrate. However, the substrate may also be any semiconductor material, such as germanium, gallium arsenide, indium phosphide and the like. In other embodiments, the substrate may be non-conductive, such as glass or sapphire wafers.

Figure 1:
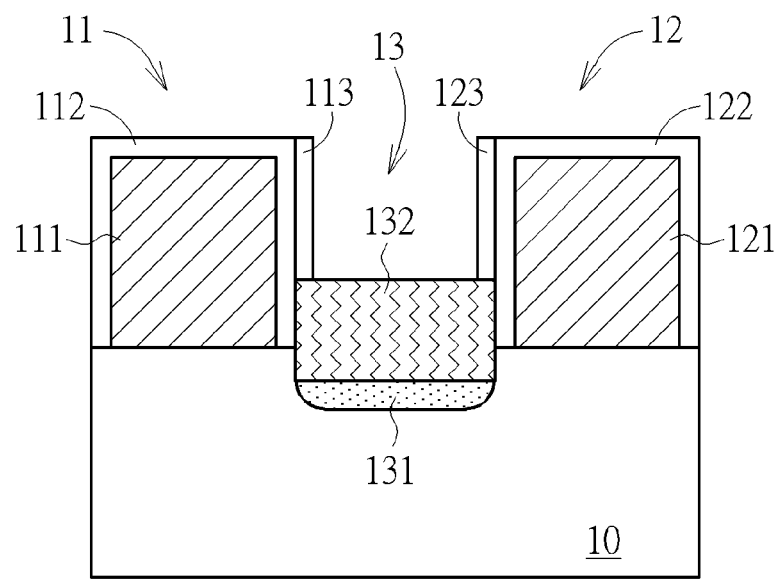
FIG. 1 to FIG. 7 are schematic, cross-sectional diagrams showing a method for fabricating a semiconductor device in accordance with one embodiment of the invention.

Referring to FIGS. 1 to 7, there is shown a schematic cross-sectional view of a method of manufacturing a semiconductor device according to an embodiment of the present invention. As shown in FIG. 1, first, a substrate 10 is provided, wherein the substrate 10 may include, but is not limited to, a silicon substrate, a silicon-containing substrate, silicon-on-gallium nitride (or silicon on other materials of the Group III-V), graphene-on-silicon substrate, or a silicon-on-insulator (SOI) substrate.

According to the embodiment of the invention, a plurality of device structures and a plurality of conductive regions between the device structures are provided on the substrate 10. The plurality of device structures may be semiconductor device structures. For example, for the sake of simplicity, only a first semiconductor device structure 11, a second semiconductor device structure 12, and a conductive region 13 are exemplified in the figures. According to the embodiment of the invention, the conductive region 13 is disposed between the first semiconductor device structure 11 and the second semiconductor device structure 12, and the conductive region 13 is contiguous with the first semiconductor device structure 11 and the second semiconductor device structure 12. According to the embodiment of the invention, the conductive region 13 comprises silicon elements.

According to the embodiment of the invention, for example, the first semiconductor device structure 11, the second semiconductor device structure 12, and the conductive region 13 may be formed within a memory array region. The first semiconductor device structure 11 and the second semiconductor device structure 12 may be bit line structures, and the conductive region 13 may be a storage node contact region for electrically connecting to a capacitor (not shown).

According to the embodiment of the invention, for example, the first semiconductor device structure 11 may comprise a conductive layer structure 111, an insulator layer 112 covering the conductive layer structure 111, and a spacer 113. According to the embodiment of the invention, for example, the second semiconductor device structure 12 may comprise a conductive layer structure 121, an insulator layer 122 covering the conductive layer structure 121, and a spacer 123.

According to the embodiment of the invention, the conductive region 13 may comprise an epitaxial layer, for example, a silicon germanium (SiGe) layer 132. According to the embodiment of the invention, the SiGe layer 132 may be doped with N type dopants, for example, arsenic or phosphorus.

According to the embodiment of the invention, the conductive region 13 may comprise a doping region 131 directly underneath the SiGe layer 132. According to the embodiment of the invention, the doping region 131 may be an N' doping region.

Figure 2:
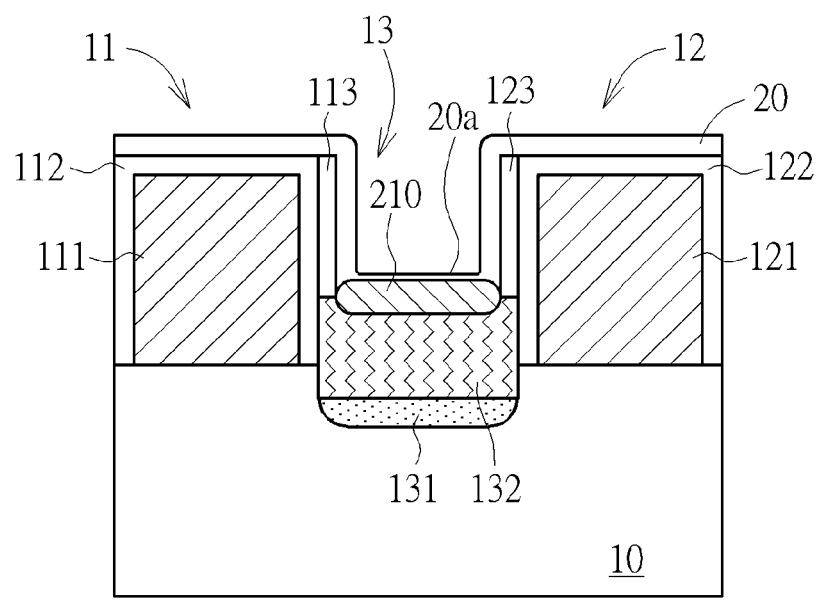

As shown in FIG. 2, a metal layer 20 is deposited on the first semiconductor device structure 11, the second semiconductor device structure 12, and the conductive region 13. For example, the metal layer 30 may comprise cobalt, nickel, or titanium. According to the embodiment of the invention, the metal layer 20 may be deposited by physical vapor deposition (PVD) methods or sputter deposition methods, but is not limited thereto. The thickness of the metal layer 20 directly above the conductive region 13 may range between 20 and 40 angstroms, for example, 30 angstroms.

According to the embodiment of the invention, the deposition of the metal layer 20 may be performed at a temperature of about 350° C. During the deposition process, the metal layer 20 reacts with the silicon elements of the conductive region 13 to thereby form a first metal silicide layer 210 having a first metal atomic percentage on the conductive region. According to the embodiment of the invention, the first metal atomic percentage may range between 50 at. % and 70 at. %, wherein the ratio of metal to silicon may range between 1:1 and 2:1.

According to the embodiment of the invention, for example, the first metal silicide layer 210 may be a cobalt silicide layer having an intermediate phase (CoSi).

According to the embodiment of the invention, after the deposition process is complete, an unreacted cobalt layer 20a is remained on the first metal silicide layer 210. According to the embodiment of the invention, the first metal silicide layer 210 has a thickness of about 50 to 150 angstroms, for example, 100 angstroms. According to the embodiment of the invention, the first metal silicide layer 210 is directly formed on the SiGe layer 132.

Figure 3:
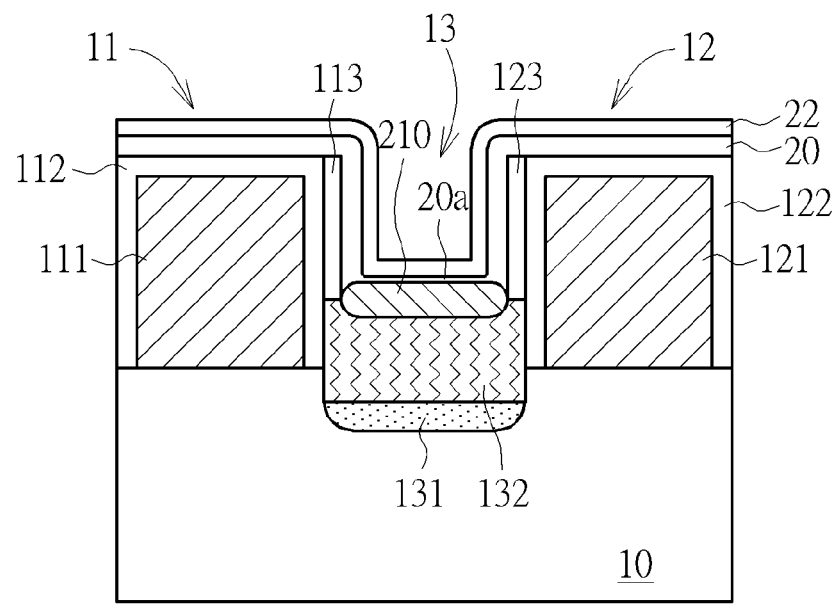

As shown in FIG. 3, a titanium nitride (TiN) layer 22 is then deposited on the metal layer 20. According to the embodiment of the invention, the TiN layer 22 may have a thickness ranging between 100 and 200 angstroms, for example, 150 angstroms. According to the embodiment of the invention, the TiN layer 22 and the metal layer 20 may be deposited in the same PVD reactor chamber, but is not limited thereto. According to the embodiment of the invention, the TiN layer 22 may comprise a titanium-rich (Ti-rich) titanium nitride layer.

Figure 4:
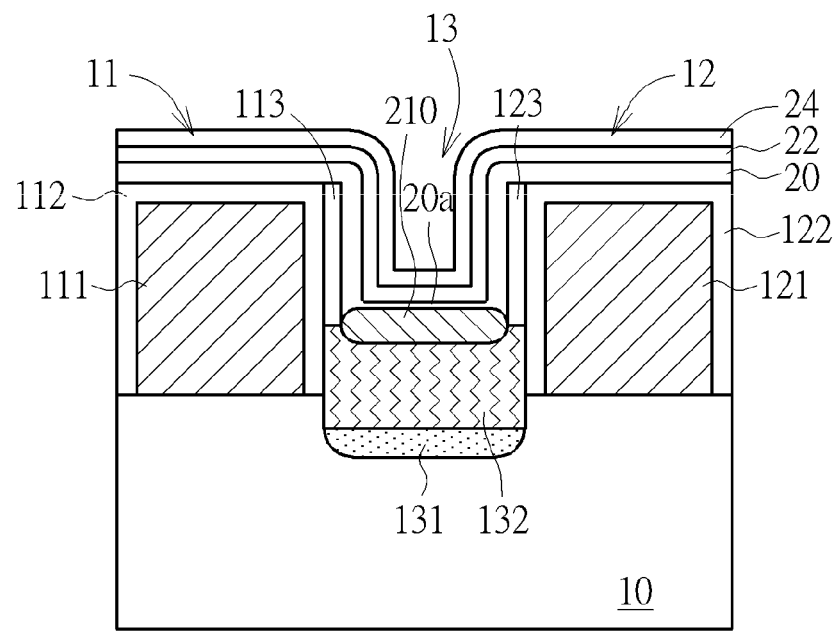

As shown in FIG. 4, a dielectric capping layer 24 on the TiN layer 22. According to the embodiment of the invention, the dielectric capping layer 24 does not contain oxygen. According to the embodiment of the invention, the dielectric capping layer 24 may be deposited by chemical vapor deposition (CVD) methods or atomic layer deposition (ALD) methods. According to the embodiment of the invention, the dielectric capping layer 24 may have a thickness ranging between 10 and 30 angstroms, for example, 20 angstroms.

According to the embodiment of the invention, the dielectric capping layer 24 may comprise a silicon nitride (SiN) layer. According to another embodiment of the invention, the dielectric capping layer 24 may comprise a silicon carbide (SiC) layer. According to another embodiment of the invention, the dielectric capping layer 24 may comprise a silicon carbon nitride (SiCN) layer.

Figure 5:
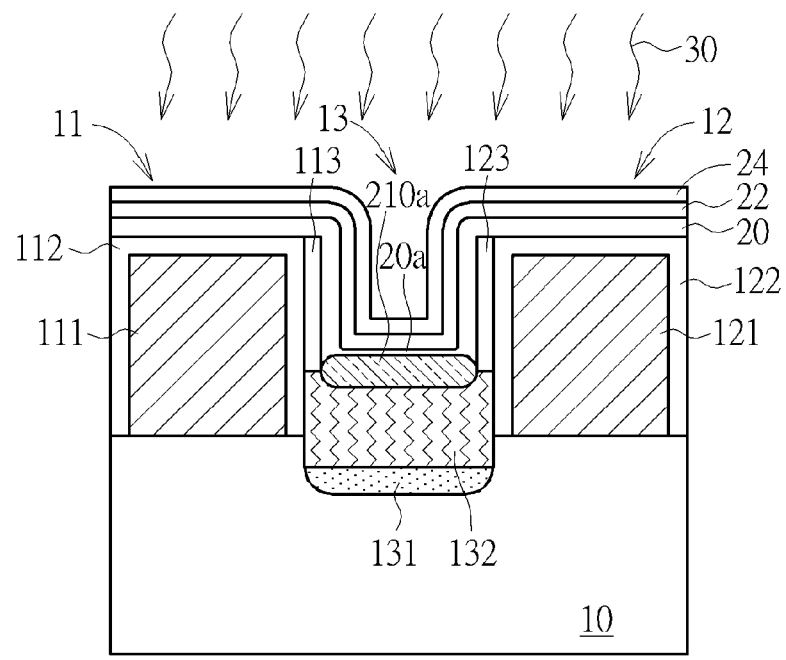

As shown in FIG. 5, an annealing process 30 such as a rapid thermal annealing process is performed to convert the first metal silicide layer 210 into a second metal silicide layer 210a having a second metal atomic percentage. The second metal silicide layer 210a may have a thickness ranging between 50 and 150 angstroms. According to the embodiment of the invention, the second metal atomic percentage is lower than the first metal atomic percentage. For example, the second metal atomic percentage may range between 30 at. % and 50 at. %, wherein the ratio of metal to silicon may range between 1:2 to 1:1.

According to the embodiment of the invention, for example, the second metal silicide layer 210a may be cobalt silicide layer having an epitaxial phase ($CoSi_2$).

According to the embodiment of the invention, for example, the annealing process 30 may be carried out at a temperature of about 650° C. for a time period of about 30 seconds.

Figure 6:
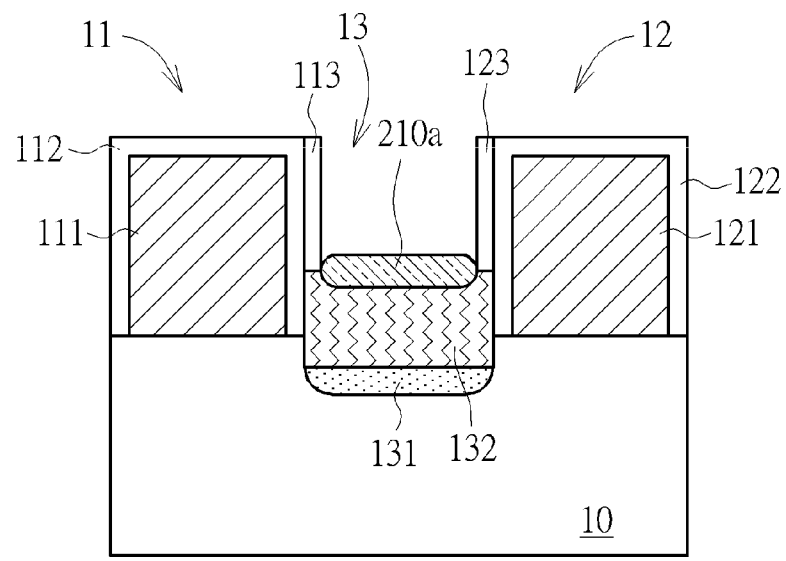

As shown in FIG. 6, the dielectric capping layer 24 is removed. For example, the dielectric capping layer 24 may be removed by using hot phosphoric acid. Subsequently, the unreacted metal layer 20a and the TiN layer 22 are removed to thereby expose a top surface of the second metal silicide layer 210a.

Figure 7:
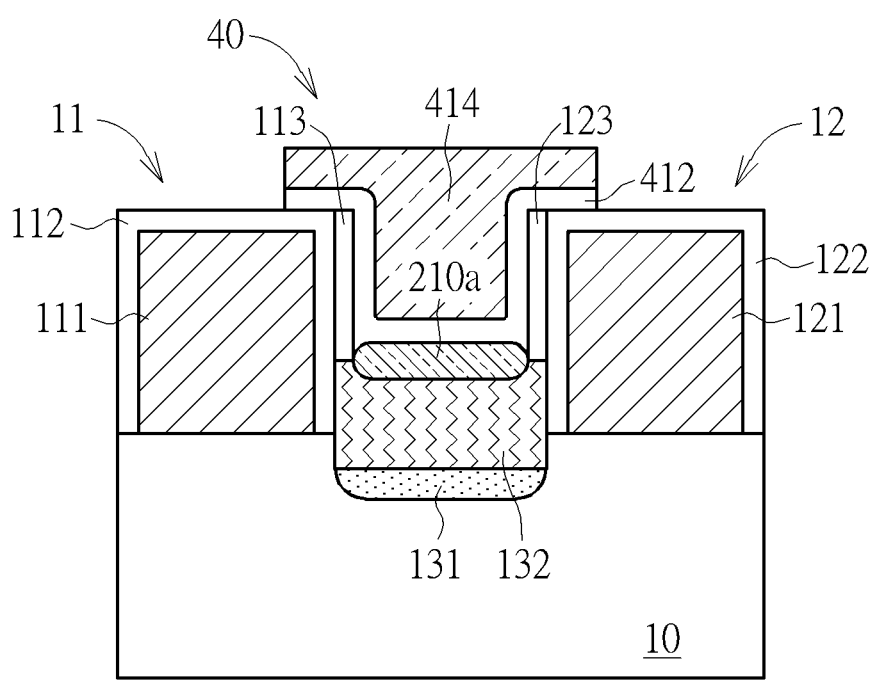

Subsequently, as shown in FIG. 7, a contact structure 40 is formed on the second metal silicide layer 210a. For example, a barrier layer 412 is deposited on the second metal silicide layer 210a, and then a tungsten layer 414 is deposited on the barrier layer 412. Thereafter, lithographic and etching processes may be performed to define the contact structure 40. According to the embodiment of the invention, the barrier layer 412 may comprise titanium or titanium nitride.

An advantage of the present invention is that by depositing a dielectric capping layer 24 on the TiN layer 22, oxygen can be prevented from passing through the TiN layer 22. The problem of cobalt oxide residual resulted from contact between oxygen and the unreacted metal layer 20a (e.g., cobalt) is solved. Thus, the method of the present invention can reduce the resistance of the contact element and further improve the performance of the semiconductor device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a semiconductor device, comprising:
   providing a substrate having device structures and conductive regions between the device structures, wherein the conductive regions comprises silicon elements;
   depositing a metal layer on the device structures and the conductive regions, wherein the metal layer reacts with the silicon elements to form a first metal silicide layer having a first metal atomic percentage on the conductive region, and wherein an unreacted metal layer is remained on the first metal silicide layer;
   depositing a titanium nitride layer on the metal layer;
   depositing a dielectric capping layer on the titanium nitride layer; and
   performing an annealing process to convert the first metal silicide layer into a second metal silicide layer having a second metal atomic percentage, wherein the second metal atomic percentage is lower than the first metal atomic percentage.

2. The method for fabricating a semiconductor device according to claim 1, wherein the conductive region comprises a SiGe layer.

3. The method for fabricating a semiconductor device according to claim 2, wherein the first metal silicide layer is formed directly on the SiGe layer.

4. The method for fabricating a semiconductor device according to claim 2, wherein the SiGe layer is doped with N type dopants.

5. The method for fabricating a semiconductor device according to claim 2, wherein the conductive region further comprises a doping region underneath the SiGe layer.

6. The method for fabricating a semiconductor device according to claim 5, wherein the doping region is an $N^+$ doping region.

7. The method for fabricating a semiconductor device according to claim 1, wherein the dielectric capping layer comprises a silicon nitride layer.

8. The method for fabricating a semiconductor device according to claim 1, wherein the dielectric capping layer comprises a silicon carbide layer.

9. The method for fabricating a semiconductor device according to claim 1, wherein the dielectric capping layer comprises a silicon carbon nitride layer.

10. The method for fabricating a semiconductor device according to claim 1, wherein the titanium nitride layer comprises a titanium-rich titanium nitride layer.

11. The method for fabricating a semiconductor device according to claim 1, wherein after the annealing process, the method further comprises:
    removing the dielectric capping layer;
    removing the titanium nitride layer; and
    removing the unreacted metal layer, thereby exposing a top surface of the second metal silicide layer.

12. The method for fabricating a semiconductor device according to claim 11, wherein after removing the unreacted metal layer, the method further comprises:
    depositing a barrier layer on the second metal silicide layer; and
    depositing a tungsten layer on the barrier layer.

13. The method for fabricating a semiconductor device according to claim 12, wherein the barrier layer comprises titanium or titanium nitride.

14. The method for fabricating a semiconductor device according to claim 1, wherein the annealing process is carried out at 650° C. for 30 seconds.

15. The method for fabricating a semiconductor device according to claim 1, wherein the metal layer has a thickness ranging between 20 and 40 angstroms directly above the conductive region.

16. The method for fabricating a semiconductor device according to claim 1, wherein the titanium nitride layer has a thickness ranging between 100 and 200 angstroms.

17. The method for fabricating a semiconductor device according to claim 1, wherein the dielectric capping layer has a thickness ranging between 10 and 30 angstroms.

18. The method for fabricating a semiconductor device according to claim 1, wherein the first metal silicide layer has a thickness ranging between 50 and 150 angstroms.

19. The method for fabricating a semiconductor device according to claim 1, wherein the second metal silicide layer has a thickness ranging between 50 and 150 angstroms.

20. The method for fabricating a semiconductor device according to claim 1, wherein the metal layer comprises cobalt, nickel, or titanium.

* * * * *